(12) United States Patent
Yu et al.

(10) Patent No.: US 9,729,162 B1
(45) Date of Patent: Aug. 8, 2017

(54) FLEXIBLE SIGNAL CHAIN PROCESSING CIRCUITS AND METHOD

(71) Applicant: SILICON LABORATORIES INC., Austin, TX (US)

(72) Inventors: Wenhuan Yu, Austin, TX (US); Abdulkerim L. Coban, Austin, TX (US)

(*) Notice: Subject to any disclaimer, the term of this patent is extended or adjusted under 35 U.S.C. 154(b) by 0 days.

(21) Appl. No.: 15/223,310

(22) Filed: Jul. 29, 2016

(51) Int. Cl.
| | |
|---|---|
| *H03M 1/06* | (2006.01) |
| *H03F 3/45* | (2006.01) |
| *H03K 5/1252* | (2006.01) |
| *H03M 1/12* | (2006.01) |
| *H03H 11/04* | (2006.01) |
| *H03M 1/00* | (2006.01) |

(52) U.S. Cl.
CPC ...... *H03M 1/0617* (2013.01); *H03F 3/45636* (2013.01); *H03F 2200/267* (2013.01); *H03F 2203/45022* (2013.01); *H03F 2203/45222* (2013.01); *H03F 2203/45528* (2013.01); *H03H 11/04* (2013.01); *H03H 11/0422* (2013.01); *H03K 5/1252* (2013.01); *H03M 1/00* (2013.01); *H03M 1/12* (2013.01)

(58) Field of Classification Search
CPC .......... H03M 1/00; H03M 1/12; H03H 11/04; H03H 11/0422; H03K 5/1252
USPC ........ 341/118, 120, 155, 156; 327/557, 551, 327/552
See application file for complete search history.

(56) References Cited

U.S. PATENT DOCUMENTS 7,521,991 B2* 4/2009 Barak ................ H03H 11/1217
327/552

OTHER PUBLICATIONS

Frank Opteynde, "25.1 A Maximally-Digital Radio Receiver Front-End," ISSCC 2010/Session 25/Wireless Connectivity, pp. 450-451, Feb. 2010.
Gerry Taylor and Ian Galton, "A Mostly-Digital Variable-Rate Continuous-Time Delta-Sigma Modulator ADC," IEEE Journal of Solid-State Circuits, vol. 45, No. 12, pp. 2634-2646, Dec. 2010.
Gerry Taylor and Ian Galton, "A Reconfigurable Mostly-Digital ΔΣ ADC With a Worst-Case FOM of 160 db," IEEE Journal of Solid-State Circuits, vol. 48 No. 4, pp. 983-995, Mar. 2013.
(Continued)

*Primary Examiner* — Joseph Lauture
(74) *Attorney, Agent, or Firm* — Polansky & Associates, P.L.L.C.; Paul J. Polansky

(57) ABSTRACT

In one form, a signal chain circuit includes a signal chain processing circuit between an input for receiving a differential input signal having a first common-mode voltage, and an output for providing a differential output signal having a second, different common-mode voltage. It includes an amplifier with a differential output stage coupled to a differential input stage and having positive and negative output terminals forming its output, and positive and negative feedback terminals. The differential output stage provides a first voltage drop between the positive output terminal and the positive feedback terminal, and a second voltage drop between the negative output terminal and the negative feedback terminal. The common-mode feedback circuit regulates a common-mode voltage between the positive and negative feedback terminals to the second common-mode voltage. In another form, an analog-to-digital converter includes a range extending logic circuit to extend the range of a ring oscillator based analog-to-digital converter.

20 Claims, 5 Drawing Sheets

(56) References Cited

OTHER PUBLICATIONS

Paul. N. Whatmough, Shidhartha Das, Zacharias Hadjilambrou, and David M. Bull, "An All-Digital Power-Delivery Monitor for Analysis of a 28nm Dual-Core ARM / Cortex A57 Cluster," ISSCC 2015/ Session 14/ Digital PLLS and SOC Building Blocks/14.6, IEEE International Solid-State Circuits Conference, pp. 262-263, Feb. 2015.

Colin Weltin-Wu, Guobi Zhao, and Ian Galton, "A 3.5 GHz Digital Fractional-N PLL Frequency Synthesizer Based on Ring Oscillator Frequency-to-Digital Conversion," IEEE Journal of Solid-State Circuits, vol. 50, No. 12, pp. 2988-3002, Dec. 2015.

* cited by examiner

FLEXIBLE SIGNAL CHAIN PROCESSING CIRCUITS AND METHOD

FIELD OF THE DISCLOSURE

The present disclosure relates generally to signal processing circuits, and more particularly to signal processing circuits such as analog-to-digital converters used in different environments.

BACKGROUND

Many radio frequency (RF) signal chain circuits such as amplifiers and filters use differential signals because they are able to effectively cancel noise. A differential signal represents an instantaneous value of a signal with a positive voltage component and a corresponding negative voltage component. The difference between the positive voltage component and the negative voltage component represents the instantaneous value of the signal. The average between the positive component and the negative component is known as the common-mode voltage. While the common-mode voltage is typically ignored by differential circuits, it is important that this voltage be set to an appropriate level. For example, amplifiers and active filters work better when the common-mode voltage falls in the middle of the supply voltage so that they can have a large signal swing. However other circuits that follow the amplifiers and active filters may require higher common-mode voltages, which introduces incompatibilities. In order to shift the common-mode voltage from one circuit to another, known circuits dissipate additional current, increase noise, and make the design of the amplifier more difficult.

An example of a signal chain processing circuit that uses differential signaling is an analog-to-digital converter (ADC). ADCs convert an analog signal into a sequence of digital codes that correspond to the analog signal. In general it is important for ADCs to have a high input range. By operating with high input range, the signal-to-noise ratio of signals in the signal chain circuit can be improved.

There are several know ADC architectures, including successive approximation, pipelined, sigma-delta, resistive ladder, and ring oscillator. In ring oscillator based ADCs, the frequency of the ring oscillator ($f_{VCO}$) is proportional to $V_{IN}$. However $f_{VCO}$ is limited according to the following inequality:

$$K^*fs < f_{VCO} < (K+1)^*fs \quad [1]$$

in which fs is the sampling frequency and K is a positive real number. If $V_{IN}$ is too low, then the ring oscillator generates just one count and if $V_{IN}$ is too high, then the ring oscillator wraps around. As a result, the full scale input range is limited. It would be desirable to increase the range of the ring oscillator without adding significant circuit area.

BRIEF DESCRIPTION OF THE DRAWINGS

The present disclosure may be better understood, and its numerous features and advantages made apparent to those skilled in the art by referencing the accompanying drawings, in which.

Figure 1:
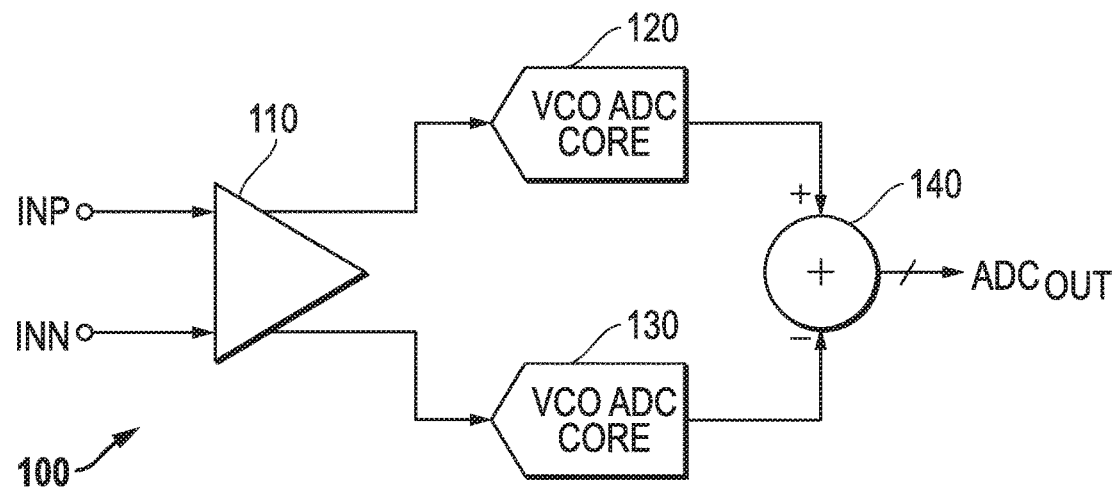
FIG. 1 illustrates in block diagram form a signal processing circuit according to an embodiment.

The use of the same reference symbols in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION

In one form, a signal chain circuit includes an input for receiving a differential input signal having a first associated common-mode voltage, an output for providing a differential output signal having a second associated common-mode voltage different than the first common-mode voltage, and a signal chain processing circuit. The signal chain processing circuit is coupled between the input and the output and includes an amplifier. The amplifier includes a differential input stage, a differential output stage, and a common-mode feedback circuit. The differential output stage is coupled to the differential input stage and has a positive output terminal coupled to the output of the signal chain circuit, a positive feedback terminal, a negative output terminal coupled to the output of the signal chain circuit, and a negative feedback terminal. The differential output stage provides a first voltage drop between the positive output terminal and the positive feedback terminal, and provides a second voltage drop between the negative output terminal and the negative feedback terminal. The common-mode feedback circuit regulates a common-mode voltage between the positive feedback terminal and the negative feedback terminal to the second associated common-mode voltage.

In another form, an analog-to-digital converter includes a ring oscillator based analog-to-digital converter, a range extending logic circuit, and a combining circuit. The ring oscillator based analog-to-digital converter has an input for receiving an input voltage, and an output for providing a digital code representative of an amplitude of the input voltage, and has a ring oscillator circuit having a plurality of stages. The range extending logic circuit is responsive to a clock signal for counting how many times the ring oscillator wraps around to provide a count signal, for capturing a first count signal at an activation of the clock signal and a second count signal at a delay from the activation of the clock signal, and for providing a count code in response to one of the first and second count signals selected by a most significant bit of the output of the ring oscillator based analog-to-digital converter. The combining circuit provides an extended digital code in response to concatenating the digital code and the count code.

In yet another form, a method includes receiving a differential input signal having a first associated common-mode voltage. The differential input signal is amplified to provide first and second amplified signals. The first amplified signal is further amplified to provide a positive output signal of a differential output signal. A voltage of the positive output signal is dropped by a predetermined voltage using a first current conducted through a first resistor to provide a positive feedback signal. The second amplified signal is further amplified to provide a negative output signal of the differential output signal. A voltage of the negative output signal is dropped by the predetermined voltage using a second current conducted through a second resistor to provide a negative feedback signal. The differential output signal having a second common-mode voltage different than the first common-mode voltage is provided in response to dropping the voltage of the positive output signal and dropping the voltage of the negative output signal.

FIG. 1 illustrates in block diagram form a signal processing circuit 100 according to an embodiment. Signal processing circuit 100 includes generally a differential amplifier 110, voltage controlled oscillator (VCO)-based analog-to-digital converter (ADC) cores 120 and 130, and a summing device 140. Amplifier 110 can be just a voltage buffer interfacing the preceding signal chain blocks to the ADC core with or without voltage gain. Amplifier 110 has inputs for receiving positive and negative components of a differential input signal labeled "INP" and "INN", respectively, and positive and negative outputs. VCO ADC core 120 has an input connected to the positive output of differential amplifier 110, and an output. VCO ADC core 130 has an input connected to the negative output of differential amplifier 110, and an output. Summing device 140 has a positive input connected to the output of VCO ADC core 120, a negative input connected to the output of VCO ADC core 130, and an output for providing an output of signal processing circuit 100 labeled "ADC$_{OUT}$".

Signal processing circuit 100 uses the VCO-based conversion technique to convert a differential input signal formed by signals INP and INN into a multi-bit digital code, ADC$_{OUT}$. In general, the VCO-based conversion technique applies the analog input voltage to a multi-stage ring oscillator, and determines a digital representation of the voltage based on the output of the stage that corresponds to the propagation of the signal through the ring oscillator. Further details of the VCO-based conversion technique will be discussed below.

Signal processing circuit 100 has two problems when used in varying signal processing systems. First, the input common-mode voltage between INP and INN, which is typically set by the preceding stage for maximum signal swing to mid-supply level (e.g., 0.65V for a 1.3V supply), is often different from the common-mode voltage needed for desirable operation of the VCO ADC cores (e.g. 0.8V for a 1.3V supply). Note that the 0.8V common mode voltage for the 1.3V supply is not a problem for the VCO based ADC because VCO based ADCs normally operate with small signal swings (e.g., 100 mV). However differential amplifier 110 needs to compensate for the difference in common-mode voltages, and compensating for the common-mode voltage difference using known techniques introduces an undesirable DC current path from the output to the input of differential amplifier 110. Also if the gain of differential amplifier 110 is programmable through a sliding switching structure, the undesirable DC current also makes the design of the amplifier and gain setting switches more difficult.

Second, the VCO frequency of VCO-based ADC cores 120 and 130, which determines the full-scale input range, is limited according to the relation $K*fs<f_{VCO}<(K+1)*fs$, in which K is a positive real number, fs is the sampling frequency, and $f_{VCO}$ is the frequency of the VCO. This relation ensures that the VCO does not wrap around and generate the same digital code for different analog inputs. Since the VCO-based ADC input voltage is proportional to $f_{VCO}$, the full-scale input voltage range, which determines the signal-to-noise ratio of the ADC, is limited by the same condition. To increase the full-scale input range, fs could be increased, but fs is limited by the semiconductor process technology.

Figure 2:
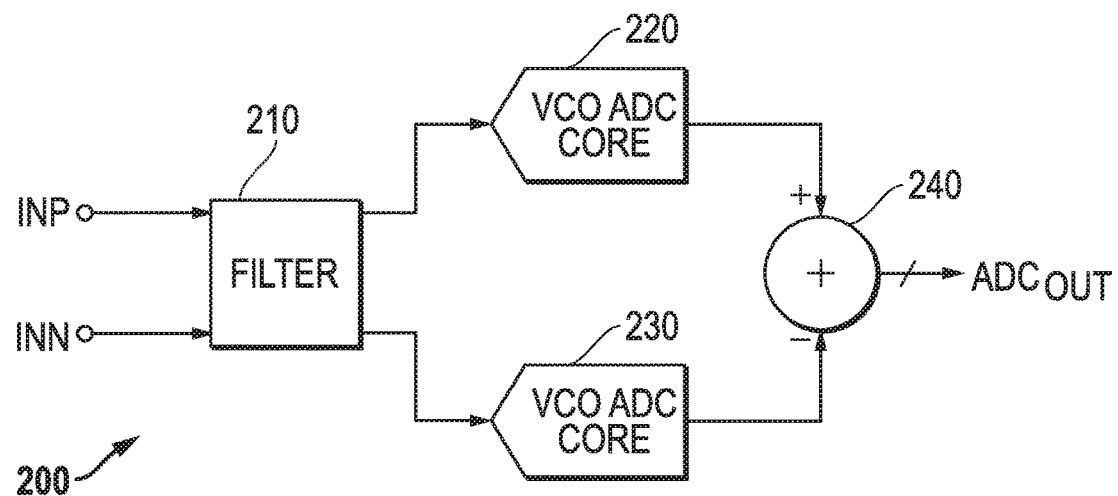
FIG. 2 illustrates in block diagram form a signal processing circuit according to another embodiment.

FIG. 2 illustrates in block diagram form a signal processing circuit 200 according to another embodiment. Signal processing circuit 200 includes generally a differential filter 210, VCO ADC cores 220 and 230, and a summing device 240. Filter 210 has inputs for receiving INP and INN, respectively, and positive and negative outputs. VCO ADC core 220 has an input connected to the positive output of differential filter 210, and an output. VCO ADC core 230 has an input connected to the negative output of differential filter 210, and an output. Summing device 240 has a positive input connected to the output of VCO ADC core 220, a negative input connected to the output of VCO ADC core 230, and an output for providing the multi-bit digital code ADC$_{OUT}$.

Signal processing circuit 200 is similar to signal processing circuit 100 of FIG. 1 except that it uses differential filter 210 at its front end. For signal processing circuit 200, the common-mode voltage can be changed according to known techniques by changing the sizes of input resistors, which in turn changes the gain of the filter. However if differential filter 210 uses multiple amplifier stages, this technique changes the common-mode voltage at the input of the first amplifier stage, and in a low-gain setting, this common-mode voltage can reach close to the output common-mode voltage (e.g., 0.8V), making it difficult for N-channel metal-oxide-semiconductor (NMOS) switches used for gain-changing to operate with the low supply voltage (e.g., 1.3V).

Figure 3:
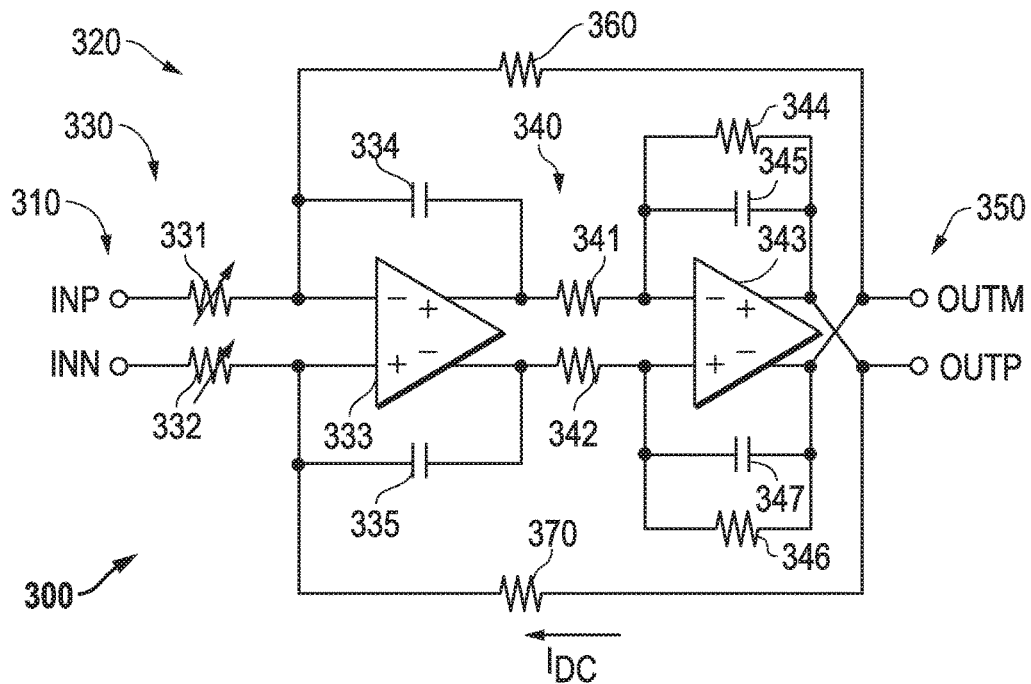
FIG. 3 illustrates in partial block diagram partial schematic form a multi-stage filter known in the prior art.

FIG. 3 illustrates in partial block diagram and partial schematic form a multi-stage filter 300 known in the prior art. Multi-stage filter 300 includes generally an input port 310, a filter 320, an output port 350, and resistors 360 and 370. Input port 310 has two nodes for receiving the INP and INN signals. Output port 350 includes two nodes for providing signals labeled "OUTP" and "OUTM".

Filter 320 includes a first filter section 330 and a second filter section 340. First filter section 330 includes variable resistors 331 and 332, an operational amplifier 333, and capacitors 334 and 335. Variable resistor 331 has a first terminal for receiving signal INP, a second terminal, and a control terminal. Variable resistor 332 has a first terminal for receiving signal INN, a second terminal, and a control terminal. Operational amplifier 333 has an inverting input terminal connected to the second terminal of variable resistor 331, a non-inverting terminal connected to the second terminal of variable resistor 332, a non-inverting output terminal, and an inverting output terminal. Capacitor 334 has a first terminal connected to the non-inverting output terminal of operational amplifier 333, and a second terminal connected to the inverting input terminal of operational amplifier 333. Capacitor 335 has a first terminal connected to the inverting output terminal of operational amplifier 333, and a second terminal connected to the non-inverting input terminal of operational amplifier 333.

Second filter section 340 includes resistors 341 and 342, an operational amplifier 343, a resistor 344, a capacitor 345, a resistor 346, and a capacitor 347. Resistor 341 has a first terminal connected to the non-inverting output of operational amplifier 333, and a second terminal. Resistor 342 has a first terminal connected to the inverting output of operational amplifier 333, and a second terminal. Operational amplifier 343 has an inverting input terminal connected to the second terminal of resistor 341, a non-inverting terminal connected to the second terminal of resistor 342, a non-inverting output terminal for providing a signal labeled "OUTP" to output port 350, and an inverting output terminal for providing a signal labeled "OUTM" to output port 350. Resistor 344 has a first terminal connected to the non-inverting output terminal of operational amplifier 343, and a second terminal connected to the inverting input terminal of operational amplifier 343. Capacitor 345 has a first terminal connected to the non-inverting output terminal of operational amplifier 343, and a second terminal connected to the inverting input terminal of operational amplifier 343. Resistor 346 has a first terminal connected to the inverting output terminal of operational amplifier 343, and a second terminal connected to the non-inverting input terminal of operational amplifier 343. Capacitor 347 has a first terminal connected to the inverting output terminal of operational amplifier 343, and a second terminal connected to the non-inverting input terminal of operational amplifier 343.

Resistor 360 has a first terminal connected to the inverting output terminal of operational amplifier 343, and a second terminal connected to the inverting input terminal of operational amplifier 333. Resistor 370 has a first terminal connected to the non-inverting output terminal of operational amplifier 343, and a second terminal connected to the non-inverting input terminal of operational amplifier 333.

Multi-stage filter 300 is a Tow-Thomas biquadratic (bi-quad) filter that uses two differential stages having four feedback resistors and four feedback capacitors to achieve a desired frequency response. Multi-stage filter 300 makes resistors 331 and 332 variable to adjust the gain as part of, e.g., a gain control loop. The input common mode voltage of the filter is usually set at half of the supply voltage (e.g., 0.65V for 1.3V supply) to provide large signal swing. The output common mode voltage of the filter is set to a value dictated by the following stage. In the example of FIG. 2, the VCO based ADCs require about 0.8V common mode voltage in order to set the desired oscillation frequency, $f_{OSC}$. However resistors 360 and 370 create a continuous DC current path from the output to the input. Current $I_{DC}$ has an average value equal to (0.8-0.65) divided by the resistance of series resistors 331 and 360 and 332 and 370, respectively. When the resistance of variable resistors 331 and 332 change, the input common mode voltage of operational amplifier 333 changes as well, making the design of the operational amplifier 333 and the switches in resistor 331 and 332 more difficult.

Figure 4:
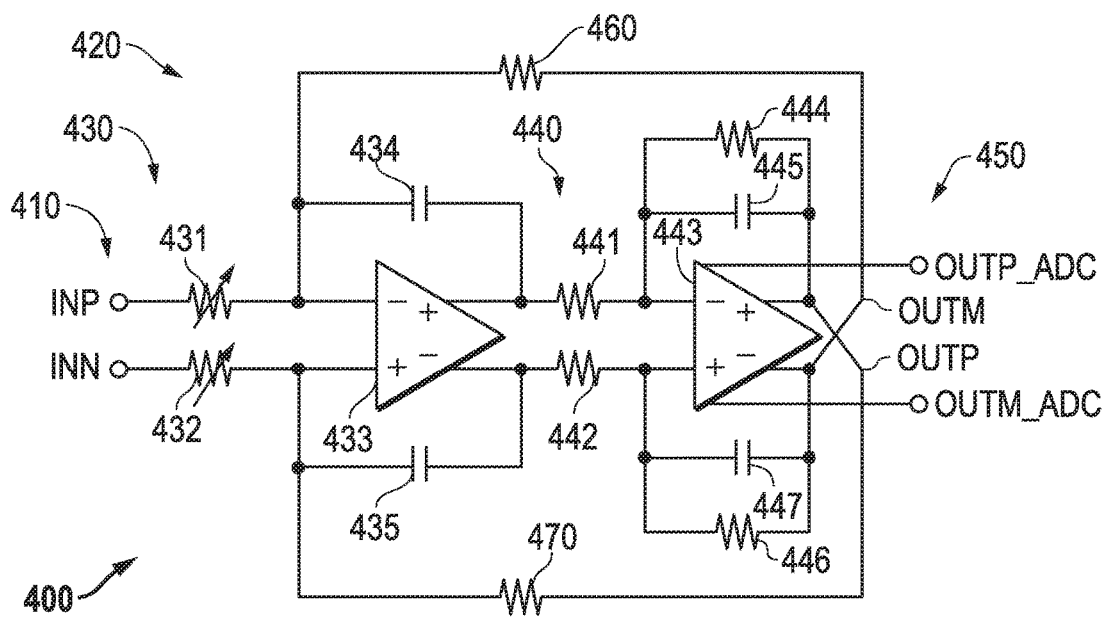
FIG. 4 illustrates in partial block diagram partial schematic form a multi-stage filter suitable for use with the signal processing circuit of FIG. 2.

FIG. 4 illustrates in partial block diagram partial schematic form a multi-stage filter 400 suitable for use with signal processing circuit 200 of FIG. 2. Multi-stage filter 400 includes generally an input port 410, a filter 420, an output port 450, and resistors 460 and 470. Input port 410 has two nodes for receiving the INP and INN signals. Output port 450 includes two nodes for providing signals labeled "OUTM_ADC" and "OUTP_ADC".

Filter 420 includes a first filter section 430 and a second filter section 440. First filter section 430 includes variable resistors 431 and 432, operational amplifier 433, and capacitors 434 and 435. Variable resistor 431 has a first terminal for receiving signal INP, a second terminal, and a control terminal. Variable resistor 432 has a first terminal for receiving signal INN, a second terminal, and a control terminal. Operational amplifier 433 has an inverting input terminal connected to the second terminal of variable resistor 431, a non-inverting terminal connected to the second terminal of variable resistor 432, a non-inverting output terminal, and an inverting output terminal. Capacitor 434 has a first terminal connected to the non-inverting output terminal of operational amplifier 433, and a second terminal connected to the inverting input terminal of operational amplifier 433. Capacitor 435 has a first terminal connected to the inverting output terminal of operational amplifier 433, and a second terminal connected to the non-inverting input terminal of operational amplifier 433.

Second filter section 440 includes variable resistors 441 and 442, an operational amplifier 443, a resistor 444, a capacitor 445, a resistor 446, and a capacitor 447. Resistor 441 has a first terminal connected to the non-inverting output of operational amplifier 433, and a second terminal. Resistor 442 has a first terminal connected to the inverting output of operational amplifier 433, and a second terminal. Operational amplifier 443 has an inverting input terminal connected to the second terminal of resistor 441, a non-inverting input terminal connected to the second terminal of resistor 442, a non-inverting feedback terminal for providing signal OUTP, an inverting feedback terminal for providing signal OUTM, a positive output terminal for providing signal OUTP_ADC to output port 450, and a negative output terminal for providing signal OUTN_ADC to output port 450. Resistor 444 has a first terminal connected to the non-inverting feedback terminal of operational amplifier 443, and a second terminal connected to the inverting input terminal of operational amplifier 443. Capacitor 445 has a first terminal connected to the non-inverting feedback terminal of operational amplifier 443, and a second terminal connected to the inverting input terminal of operational amplifier 443. Resistor 446 has a first terminal connected to the inverting output terminal of operational amplifier 443, and a second terminal connected to the non-inverting input terminal of operational amplifier 433. Capacitor 447 has a first terminal connected to the inverting feedback terminal of operational amplifier 443, and a second terminal connected to the non-inverting input terminal of operational amplifier 443.

Resistor 460 has a first terminal connected to the inverting feedback terminal of operational amplifier 443, and a second terminal connected to the inverting input terminal of operational amplifier 433. Resistor 470 has a first terminal connected to the non-inverting feedback terminal of operational amplifier 443, and a second terminal connected to the non-inverting input terminal of operational amplifier 433.

In operation, multi-stage filter 400 (like multi-stage filter 300 of FIG. 3) is a Tow-Thomas biquad filter suitable for use in signal processing circuit 200 of FIG. 2. However multi-stage filter 400 adjusts the output common-mode voltage to a higher voltage without the undesirable characteristics of multi-stage filter 300.

Multi-stage filter 400 forms signals OUTP and OUTM as an un-shifted differential output having a common-mode voltage of 0.65 volts, and uses these signals as feedback signals within multi-stage filter 400. Multi-stage filter 400 forms signals OUTP_ADC and OUTM_ADC as a shifted differential output signal having a higher common-mode voltage of 0.8 volts, and uses these signals to drive the subsequent stage (e.g. VCO ADC cores 220 and 230 if multi-stage filter 400 is used in signal processing circuit 200 of FIG. 2). In other words, one uniform common-mode voltage (0.65V) is used inside multi-stage filter 400, while the shifted common-mode voltage (0.8V) is used to drive the VCO ADC core. The way in which multi-stage filter 400 forms output signals with a shifted common-mode voltage will now be described.

Figure 5:
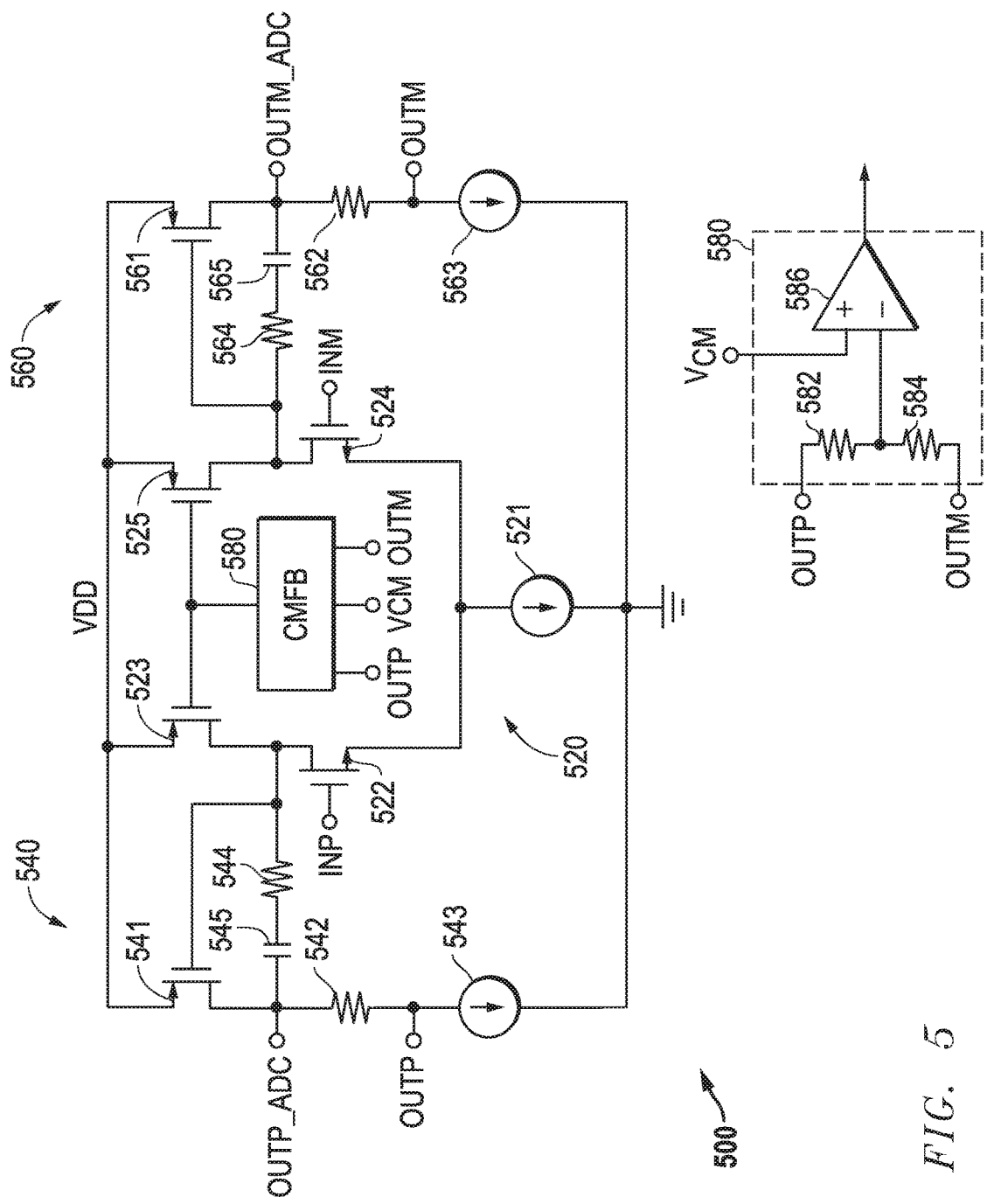
FIG. 5 illustrates in partial block diagram and partial schematic form an amplifier suitable for use in the multi-stage filter of FIG. 4.

FIG. 5 illustrates in partial block diagram and partial schematic form an amplifier 500 suitable for use in multi-stage filter 400 of FIG. 4. Amplifier 500 can be used for operational amplifier 443 of FIG. 4. Amplifier 500 includes generally an input stage 520, an output stage having a positive portion 540 and a negative portion 560, and a common-mode feedback circuit 580.

Input stage 520 includes a current source 521, an N-channel transistor 522, a P-channel transistor 523, an N-channel transistor 524, and a P-channel transistor 525. Current source 521 has a first terminal, and a second terminal connected to ground. Transistor 522 has a drain, a gate for receiving signal INP, and a source connected to the first terminal of current source 521. Transistor 523 has a source connected to a positive power supply voltage terminal labeled "VDD", a gate, and a drain connected to the drain of transistor 522. Transistor 524 has a drain, a gate for receiving signal INN, and a source connected to the first terminal of current source 521. Transistor 525 has a source connected to VDD, a gate, and a drain connected to the drain of transistor 524.

Positive portion of the output stage 540 includes a P-channel transistor 541, a voltage shifting resistor 542, a current source 543, a compensation network formed by a resistor 544, and a capacitor 545. Transistor 541 has a source connected to VDD, a gate connected to the drains of transistors 522 and 523, and a drain for providing signal OUTP_ADC. Resistor 542 has a first terminal connected to the drain of transistor 541, and a second terminal for providing signal OUTP. Current source 543 has a first terminal connected to the second terminal of resistor 542, and a second terminal connected to ground. Resistor 544 has a first terminal connected to the drains of transistors 522 and 523, and a second terminal. Capacitor 545 has a first terminal connected to the second terminal of resistor 544, and a second terminal connected to the drain of transistor 541.

Negative portion of the output stage 560 includes a P-channel transistor 561, a voltage shifting resistor 562, a current source 563, a compensation network formed by a resistor 564, and a capacitor 565. Transistor 561 includes a source connected to VDD, a gate connected to the drains of transistors 524 and 525, and a drain for providing signal OUTM_ADC. Resistor 562 has a first terminal connected to the drain of transistor 561, and a second terminal for providing signal OUTM. Current source 563 has a first terminal connected to the second terminal of resistor 562, and a second terminal connected to ground. Resistor 564 has a first terminal connected to the drains of transistors 524 and 525, and a second terminal. Capacitor 565 has a first terminal connected to the second terminal of resistor 564, and a second terminal connected to the drain of transistor 561.

Common-mode feedback circuit 580 has inputs for receiving signals OUTP, OUTM, and a common-mode voltage reference voltage labeled "VCM", and an output connected to the gates of transistors 523 and 525. Common-mode feedback circuit 580 includes resistors 582 and 584, and an amplifier 586. Resistor 582 has a first terminal for receiving signal OUTP, and a second terminal. Resistor 584 has a first terminal connected to the second terminal of resistor 582, and a second terminal for receiving signal OUTM. Amplifier 586 has a non-inverting input for receiving a reference voltage labeled "VCM", an inverting input terminal connected the second terminals of resistors 582 and 584 (which measures the common mode voltage of OUTP and OUTM), and an output connected to the gates of transistors 523 and 525.

In operation, input stage 520 forms a CMOS differential amplifier stage. Input stage 520 drives transistor 541 in positive portion 540 and transistor 561 in negative portion 560 from the drains of transistors 522 and 524, respectively. Resistor 544 and capacitor 545 provide Miller compensation to the drain of transistor 541, while resistor 564 and capacitor 565 provide Miller compensation to the drain of transistor 561. Common-mode feedback circuit 580 uses amplifier 586 to amplify the difference between the measured common-mode voltage and the desired common-mode voltage VCM. Using closed loop feedback, amplifier 586 modifies its output voltage to make the measured common-mode voltage equal to VCM. Output stages 540 and 560 use resistors 542 and 562 in creating a voltage drop between OUTP_ADC and OUTP, and OUTM_ADC and OUTM, respectively. Resistors 542 and 562 are sized such that the current of current source 543 (563) times the resistance of resistor 542 (562) is equal to the desired difference in common-mode voltage difference, or 0.8−0.65=0.15 volts. By adding output resistors 542 and 562 to shift the output common-mode voltage for driving the ring oscillator based ADC, amplifier 500 avoids the undesirable characteristic of multi-stage filter 300.

Note that the technique described above can be used in other filter or amplifier topologies. For example, the common-mode shifting technique can be applied to a corresponding multi-stage amplifier used as amplifier 110 in signal processing circuit 100 of FIG. 1. Also other filters besides biquads and Tow-Thomas biquads can be formed with amplifiers using the common-mode shifting technique described above.

Figure 6:
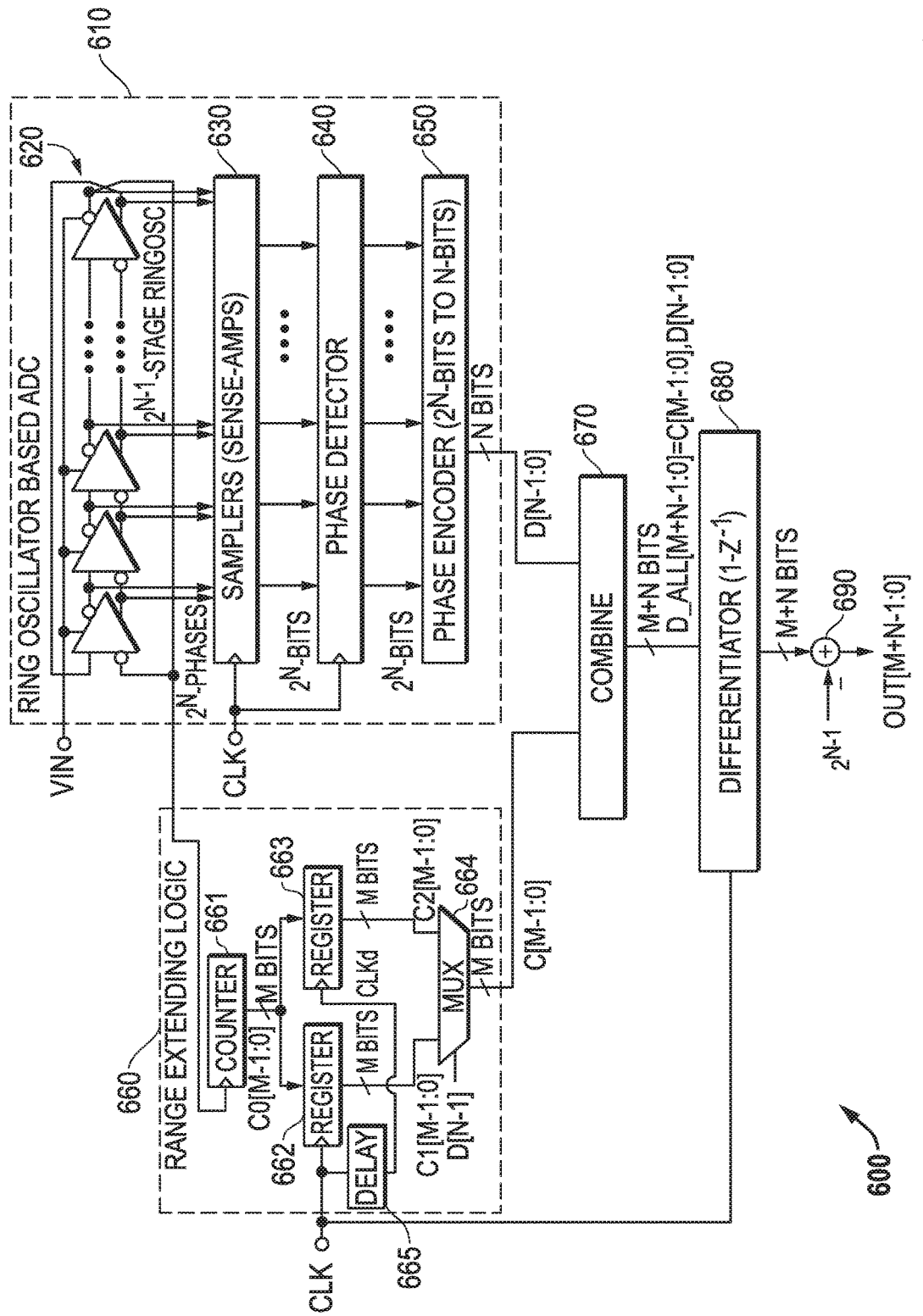
FIG. 6 illustrates in block diagram form an analog-to-digital converter with full scale input range extension, which is suitable for use in the signal processing circuits of FIGS. 1 and 2.

FIG. 6 illustrates in block diagram form an analog-to-digital converter 600 with full scale input range extension, which is suitable for use in signal processing circuits 100 and 200 of FIGS. 1 and 2. Analog-to-digital converter 600 includes generally a ring oscillator based analog-to-digital converter 610, a range extending logic circuit 660, and a combining circuit including a combining register 670, a differentiator 680, and a subtractor 690.

Ring oscillator based analog-to-digital converter 610 includes a ring oscillator circuit 620, a sampler circuit 630, a phase detector 640, and a phase encoder 650. Ring oscillator circuit 620 is a $2^{N-1}$-stage pseudo-differential ring oscillator providing $2^N$ phase signals. Each stage includes a differential amplifier having true and complementary inputs, true and complementary outputs, and a control input for receiving a signal labeled "$V_{IN}$". The true output of the first stage is connected to the complementary input of the second stage, while the complementary output of the first stage is connected to the true input of the second stage. Each stage is connected to its succeeding stage in the same manner, until the last stage. The true output of the last stage is connected to the complementary input of the first stage, while the complementary output of the last stage is connected to the true input of the first stage. Sampler circuit 630 has $2^N$ phase inputs connected to corresponding phase outputs of ring oscillator circuit 620, a clock input for receiving a clock signal labeled "CLK", and $2^N$ outputs corresponding to the differential inputs. Phase detector 640 has $2^N$ inputs connected to corresponding outputs of sampler circuit 630, a clock input for receiving the CLK signal, and $2^N$ single-ended outputs corresponding to the differential inputs. Phase encoder 650 has $2^N$ inputs connected to corresponding outputs of phase detector 640, and an output for providing an N-bit digital code labeled "D[N−1:0]".

Range extending logic circuit 660 includes a counter 661, registers 662 and 663, a multiplexer 664, and a delay element 665. Counter 661 has a clock input connected to the complementary output of the last stage of ring oscillator circuit 620, and an output for providing an M-bit output signal labeled "C0[M−1:0]". Register 662 has an input connected to the output of counter 661, a clock input for receiving the CLK signal, and an output for providing an M-bit output signal labeled "C1[M−1:0]". Register 663 has an input connected to the output of counter 661, a clock input for receiving a delayed clock signal labeled "CLKd", and an output for providing an M-bit output signal labeled "C2[M−1:0]". Multiplexer 664 has a first input connected to the output of register 662, a second input connected to the output of register 663, an output for providing a final M-bit count signal labeled "C[M−1:0]", and a control input for receiving signal D[N−1]. Delay element 665 has an input for receiving the CLK signal, and an output for providing the delayed clock signal CLKd.

In the combining circuit, combining register 670 has a first input connected to the output of multiplexer 664, a second input connected to the output of phase encoder 650, and an output for providing an M+N bit output labeled D_ALL[M+N−1:0]. Differentiator 680 has an input connected to the output of combining register 670, a clock input for receiving the CLK signal, and an output for providing an M+N bit output. Subtractor 690 has a positive input connected to the output of differentiator 680, a negative input for receiving a constant labeled "$2^{N-1}$", and an output for providing an output signal labeled "OUT[M+N−1:0]".

In operation, analog-to-digital converter 600 uses the simplicity of the ring oscillator based ADC architecture but extends its input range reliably and efficiently. Ring oscillator circuit 620 receives analog input voltage $V_{IN}$ and oscillates at a frequency proportional to $V_{IN}$. Thus as $V_{IN}$ increases, the delay through each differential amplifier stage decreases, which would eventually cause the output of the last stage to be provided to the input of the first stage in a shorter period of time. Sampler circuit 630 captures the state of ring oscillator circuit 620 synchronously with respect to the CLK signal. The samplers in sampler circuit 630 are differential sense amplifiers that convert the difference in voltage between the true and complement signals into corresponding binary true and complement signals. Thus sampler circuit 630 provides a thermometer code that indicates how far down the differential amplifier chain $V_{IN}$ has caused the input signal to propagate during one cycle of the CLK signal. Phase detector 640 and phase encoder 650 convert the $2^N$ bit wide output of samplers 630 into an N-bit encoded digital signal D[N−1:0].

Range extending logic circuit 660 counts the transitions in the output of the last stage of ring oscillator circuit 620. In particular, counter 661 counts in response to the complementary output of the last stage of ring oscillator circuit 620. Thus range extending logic circuit 660 extends the range of $V_{IN}$ in an amount corresponding to the number of extra bits supported. For example if M=1, then the input range is expanded by a factor of $2^1$=2, if M=2, then the input range is expanded by a factor of $2^2$=4, etc.

Range extending logic circuit 660 uses an unwrapping counter (counter 661) but does so with enhanced reliability. If counter 661 were used by itself, then range extending logic circuit 660 would operate unreliably if the output of counter 661 were sampled during a transition. Range extending logic circuit 660 double samples the output of counter 661 using both the CLK signal and a delayed version of the CLK signal, namely the CLKd signal, and multiplexer 664 selects one of these two signals based on the value of the most significant bit of the output of ring oscillator based ADC 610. The reason why this double sampling and selection provide the correct result will now be described.

Figure 7:
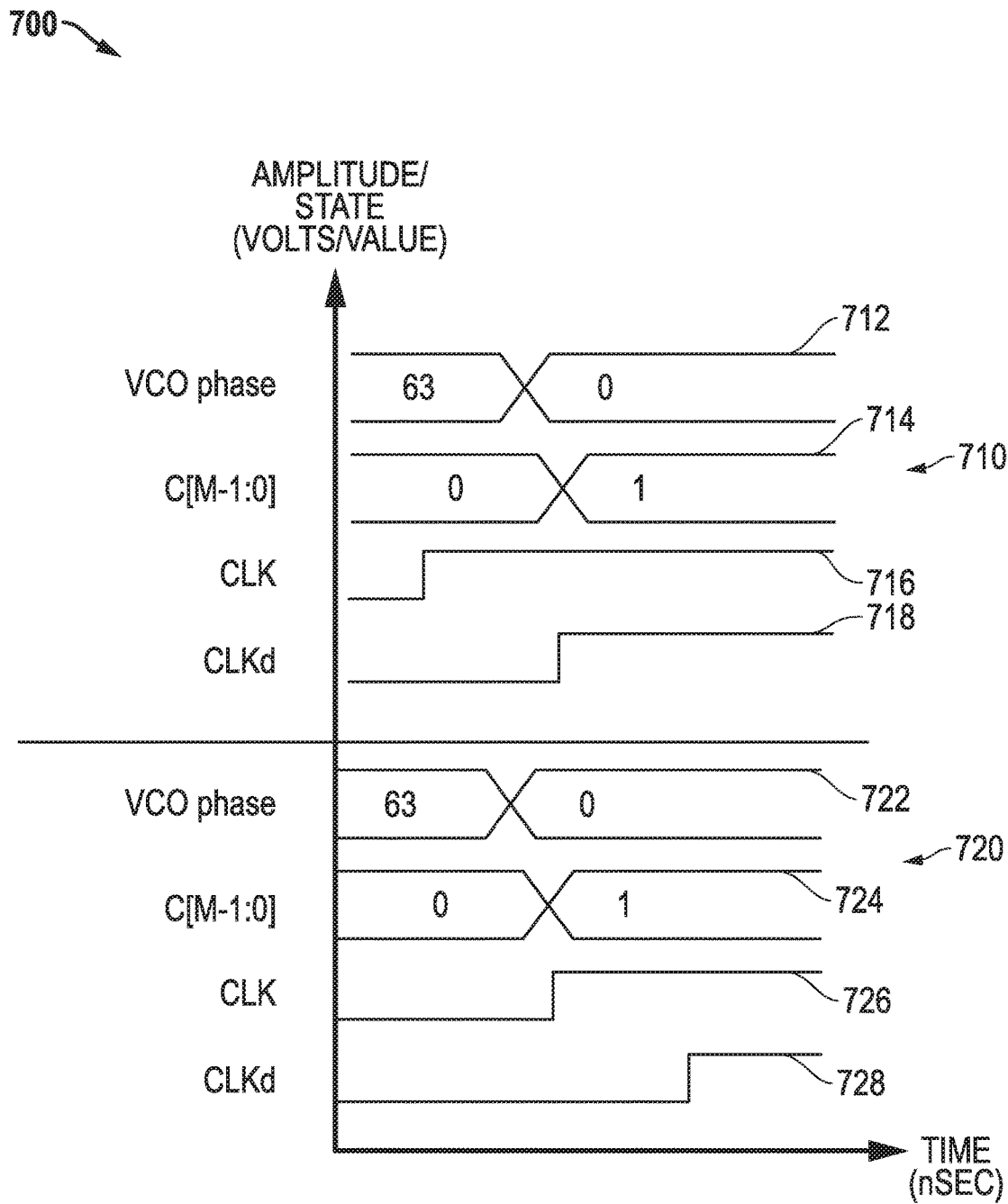
FIG. 7 illustrates a timing diagram of the operation of the analog-to-digital converter of FIG. 6.

FIG. 7 illustrates a timing diagram 700 of the operation of analog-to-digital converter 600 of FIG. 6. In timing diagram 700, the horizontal axis represents time in nanoseconds (nsec), whereas the vertical axis represents the amplitude or state of signals in volts or values, respectively, as the case may be. Timing diagram shows a first set of waveforms 710 and a second set of waveforms 720. Waveforms 710 includes a waveform 712 indicating the value of a corresponding VCO phase, a waveform 714 indicating a value of the output of counter 661, namely signals C0[M−1:0], a waveform 716 indicating the voltage of the CLK signal, and a waveform 718 indicating the voltage of the CLKd signal. Waveforms 720 includes a waveform 722 indicating the value of the corresponding VCO phase, a waveform 724 indicating a value of the output of counter 661, namely signals C0[M−1:0], a waveform 726 indicating the voltage of the CLK signal, and a waveform 728 indicating the voltage of the CLKd signal.

Timing diagram 700 illustrates an example in which N=6 and M=1. Ring oscillator circuit 620 thus includes 32 differential stages and phase encoder 650 provides a 6-bit encoded output signal. In waveforms 710, the VCO phase reaches 63 and subsequently rolls over to 0 (which would have been 64 if more bits were available). In this case, it is appropriate to use the CLK signal to sample C[M−1:0], which samples it at a value of 0. Thus multiplexer 664 selects the output of register 662 and concatenates [0xxxxxx] with [x111111] to get [01111111]=63. On the other hand in waveforms 720, it is appropriate to use the CLKd signal to sample C[M−1:0], which samples it at a value of 1. Thus multiplexer 664 selects the output of register 663 and concatenates [1xxxxxx] with [x000000] to get [1000000]=64, and again yielding the correct result. The multiplexing depends on the value of D[N−1], which is the sampling result of VCO phase with CLK, as shown in FIG. 6. If D[N−1] equals one, analog-to-digital converter 600 produces the case shown in waveforms 710. Otherwise, if D[N−1] equals zero, analog-to-digital converter 600 produces the case shown in waveforms 720. Thus analog-to-digital converter 600 provides a clean transition from the values of $2^N-1$ to $2^N$ and extends the range from 64 to 128, as long as the delay of delay block 665 is longer than the clock to data delay of counter 661.

Note that the N=6 and M=1 is merely one example, and other examples are possible. If M=2, then D[N−1] would select between two two-bit values, etc.

The above-disclosed subject matter is to be considered illustrative, and not restrictive, and the appended claims are intended to cover all such modifications, enhancements, and other embodiments that fall within the true scope of the claims. For example, the common-mode feedback adjustment circuit can be used in various signal chain circuits such as amplifiers, filters, mixers, and the like. Moreover, this adjustment could be applied to various filter architectures in addition to the Tow-Thomas biquad filter architecture shown in FIGS. 3 and 4.

Thus, to the maximum extent allowed by law, the scope of the present invention is to be determined by the broadest permissible interpretation of the following claims and their equivalents, and shall not be restricted or limited by the foregoing detailed description.

What is claimed is:

1. A signal chain circuit comprising:
   an input for receiving a differential input signal having a first associated common-mode voltage;

an output for providing a differential output signal having a second associated common-mode voltage different than said first common-mode voltage; and a signal chain processing circuit coupled between said input and said output and having an amplifier comprising:

a differential input stage;

a differential output stage coupled to said differential input stage and having a positive output terminal coupled to said output of the signal chain circuit, a positive feedback terminal different from said positive output terminal, a negative output terminal coupled to said output of the signal chain circuit, and a negative feedback terminal different from said negative output terminal, wherein said differential output stage provides a first voltage drop between said positive output terminal and said positive feedback terminal, and provides a second voltage drop between said negative output terminal and said negative feedback terminal; and a common-mode feedback circuit for regulating a common-mode voltage between said positive feedback terminal and said negative feedback terminal to said second associated common-mode voltage.

2. The signal chain circuit of claim 1, wherein said differential output stage provides said first voltage drop using a first resistor and said second voltage drop using a second resistor.

3. The signal chain circuit of claim 1, wherein said differential input stage comprises:

a current source having a first terminal and a second terminal coupled to a first power supply voltage terminal for conducting a predetermined current;

a first transistor having a first current electrode, a control electrode for receiving a positive input signal, and a second current electrode coupled to said first terminal of said current source;

a second transistor having a first current electrode coupled to a second power supply voltage terminal, a control electrode coupled to said common-mode feedback circuit, and a second current electrode coupled to said first current electrode of said first transistor;

a third transistor having a first current electrode, a control electrode for receiving a negative input signal, and a second current electrode coupled to said first terminal of said current source; and a fourth transistor having a first current electrode coupled to said second power supply voltage terminal, a control electrode coupled to said common-mode feedback circuit, and a second current electrode coupled to said first current electrode of said third transistor.

4. The signal chain circuit of claim 3, wherein said differential output stage comprises:

a positive output portion responsive to a voltage at said first current electrode of said first transistor for providing a positive output signal at said positive output terminal and a positive feedback signal at said positive feedback terminal; and a negative output portion responsive to a voltage at said first current electrode of said third transistor for providing a negative output signal at said negative output terminal and a negative feedback signal at said negative feedback terminal.

5. The signal chain circuit of claim 4, wherein said positive output portion comprises:

a first transistor having a first current electrode coupled to said second power supply voltage terminal, a control electrode coupled to said first current electrode of said first transistor of said differential input stage, and a second current electrode coupled to said positive output terminal;

a first resistor having a first terminal coupled to said second current electrode of said first transistor, and a second current electrode coupled to said positive feedback terminal; and a first current source having a first terminal coupled to said second terminal of said first resistor, and a second terminal coupled to said first power supply voltage terminal.

6. The signal chain circuit of claim 5, wherein said negative output portion comprises:

a second transistor having a first current electrode coupled to said second power supply voltage terminal, a control electrode coupled to said first current electrode of said third transistor of said differential input stage, and a second current electrode coupled to said negative output terminal;

a second resistor having a first terminal coupled to said second current electrode of said second transistor, and a second current electrode coupled to said negative feedback terminal; and a second current source having a first terminal coupled to said second terminal of said second resistor, and a second terminal coupled to said first power supply voltage terminal.

7. The signal chain circuit of claim 6, wherein said positive output portion further comprises:

a third resistor having a first terminal coupled to said first current electrode of said first transistor of said differential input stage, and a second terminal; and a first capacitor having a first terminal coupled to said second terminal of said second resistor, and a second terminal coupled to said second current electrode of said first transistor of said positive output portion.

8. The signal chain circuit of claim 7, wherein said negative output portion further comprises:

a fourth resistor having a first terminal coupled to said first current electrode of said third transistor of said differential input stage, and a second terminal; and a second capacitor having a first terminal coupled to said second terminal of said fourth resistor, and a second terminal coupled to said second current electrode of said second transistor.

9. The signal chain circuit of claim 1, wherein said common-mode feedback circuit comprises:

a first resistor having a first terminal coupled to said positive output terminal of said output stage, and a second terminal;

a second resistor having a first terminal coupled to said second terminal of said first resistor, and a second terminal coupled to said negative terminal of said output stage; and an amplifier having a first terminal for receiving a reference voltage corresponding to said second associated common-mode voltage, a second terminal coupled to said second terminal of said first resistor, and an output coupled to said differential input stage.

10. The signal chain circuit of claim 1, wherein said signal chain processing circuit operates as a filter.

11. The signal chain circuit of claim 10, wherein said signal chain processing circuit comprises a biquadratic filter.

12. An analog-to-digital converter comprising:

a ring oscillator based analog-to-digital converter having an input for receiving an input voltage, and an output for providing a digital code representative of an amplitude of said input voltage, and having a ring oscillator circuit having a plurality of stages;

a range extending logic circuit responsive to a clock signal for counting how many times said ring oscillator based analog-to-digital converter wraps around to provide a count signal, for capturing a first count signal at an activation of said clock signal and a second count signal at a delay from said activation of said clock signal, and for providing a count code in response to one of said first and second count signals selected by a most significant bit of said output of said ring oscillator based analog-to-digital converter; and a combining circuit for providing an extended digital code in response to concatenating said digital code and said count code.

13. The analog-to-digital converter of claim 12 wherein said combining circuit comprises:

a combining register having a first input for receiving said digital code, a second input for receiving said count code, and an output, wherein said combining register provides said extended digital code in response to said output of said combining register.

14. The analog-to-digital converter of claim 13 wherein said combining circuit further comprises:

a differentiator responsive to said extended digital code to combine a plurality of samples of said extended digital code over a predetermined period, wherein said combining circuit provides an output digital code in response to an output of said differentiator.

15. The analog-to-digital converter of claim 14 wherein said combining circuit further comprises:

a subtractor having a positive input coupled to said output of said differentiator, a negative input for receiving a value corresponding to a most significant bit of said extended digital code, and an output for providing said output digital code.

16. The analog-to-digital converter of claim 12 wherein said range extending logic circuit comprises:

a counter having a clock input for receiving an output of said ring oscillator circuit, and an output;

a first register having an input coupled to said output of said counter, a clock input for receiving said clock signal, and an output;

a delay circuit having an input for receiving said clock signal, and an output for providing a delayed clock signal;

a second register having an input coupled to said output of said counter, a clock input coupled to said output of said delay circuit, and an output; and a multiplexer having a first input coupled to said output of said first register, a second input coupled to said output of said second register, a control input for receiving said most significant bit of said output of said ring oscillator based analog-to-digital converter, and an output for providing said extended digital code.

17. The analog-to-digital converter of claim 12 wherein said ring oscillator based analog-to-digital converter further comprises:

a sampler circuit having an input coupled to an output of said ring oscillator circuit, a clock input for receiving said clock signal, and an output;

a phase detector having an input coupled to said output of said sampler circuit, a clock input for receiving said clock signal, and an output; and a phase encoder having an input coupled to said output of said phase detector, and an output for providing said digital code.

18. A method comprising:

receiving a differential input signal having a first associated common-mode voltage;

amplifying said differential input signal to provide first and second amplified signals;

further amplifying said first amplified signal to provide a positive output signal of a differential output signal;

dropping a voltage of said positive output signal by a predetermined voltage using a first current conducted through a first resistor to provide a positive feedback signal different from said positive output signal;

further amplifying said second amplified signal to provide a negative output signal of said differential output signal;

dropping a voltage of said negative output signal by said predetermined voltage using a second current conducted through a second resistor to provide a negative feedback signal different from said negative output signal; and providing said differential output signal having a second common-mode voltage different than said first common-mode voltage in response to said dropping said voltage of said positive output signal and said dropping said voltage of said negative output signal.

19. The method of claim 18 further comprising:

feeding back said positive feedback signal to a positive input signal of said differential input signal through a first impedance network; and feeding back said negative feedback signal to a negative input signal of said differential input signal through a second impedance network.

20. The method of claim 18 further comprising:

regulating said second common-mode voltage in response to a desired value, wherein said regulating includes altering said amplifying said differential input signal in response to a difference between a measured common-mode voltage and said desired value.

* * * * *